United States Patent
Wang

(10) Patent No.: US 11,081,036 B1
(45) Date of Patent: Aug. 3, 2021

(54) SLEW RATE ENHANCEMENT CIRCUIT

(71) Applicant: Novatek Microelectronics Corp., Hsinchu (TW)

(72) Inventor: Ying-Hsiang Wang, New Taipei (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/934,038

(22) Filed: Jul. 21, 2020

(51) Int. Cl.
    *G09G 3/20*      (2006.01)
    *H03K 5/24*      (2006.01)
    *H03F 3/45*      (2006.01)

(52) U.S. Cl.
CPC .............. *G09G 3/20* (2013.01); *H03K 5/24* (2013.01); *G09G 2310/027* (2013.01); *G09G 2310/0243* (2013.01); *G09G 2310/0267* (2013.01); *G09G 2310/0291* (2013.01); *G09G 2310/06* (2013.01); *G09G 2330/021* (2013.01); *H03F 3/45475* (2013.01); *H03F 2203/45594* (2013.01)

(58) Field of Classification Search
CPC ............. H03F 3/45179; H03F 3/45632; H03F 3/45475; H03F 2203/45594; G09G 3/20; G09G 3/3258; G09G 3/3696; G09G 2310/0291; G09G 2310/0297; G09G 2320/0276; G09G 2320/0673; G09G 2330/028; G09G 2310/0243; G09G 2310/0267; G09G 2310/027; G09G 2310/06; G09G 2330/021; G09G 3/3233; G09G 3/3275; G09G 3/3688; G09G 2310/0264; G09G 2310/0275; G09G 3/3685; H03M 1/68; H03M 1/74; H03M 1/76; H03K 5/24; H03K 19/00369; H03K 19/017509; H03K 5/1534
See application file for complete search history.

(56) References Cited

U.S. PATENT DOCUMENTS

2016/0093270 A1* 3/2016 Lee ...................... G09G 3/3688
                                                              345/690
2018/0158408 A1* 6/2018 Chae .................... G09G 3/3233

\* cited by examiner

*Primary Examiner* — Nelson M Rosario
(74) *Attorney, Agent, or Firm* — JCIPRNET

(57) ABSTRACT

The disclosure provides a slew rate enhancement apparatus that is connected to an operational amplifier that receives an input signal and generates an output signal according to the input signal for driving a pixel. The slew rate enhancement apparatus comprises a signal edge detector, a comparator, an adjustment unit. The signal edge detector is coupled to the operational amplifier and configured to detect a signal edge and outputting a difference signal corresponding to a difference between the input and output signals. The comparator is coupled to the signal edge detector to receive the difference signal and configured to generate a control signal according to the difference signal. The adjustment unit is coupled to the comparator to receive the control signal, and configured to couple a compensation signal generated by a current source to the operational amplifier according to the control signal to enhance a slew rate of the operation amplifier.

18 Claims, 8 Drawing Sheets

SLEW RATE ENHANCEMENT CIRCUIT

BACKGROUND

Technical Field

This disclosure relates to a slew rate enhancement (SRE) circuit, and more particularly, to a circuit on improving slew rate of a buffer circuit.

Description of Related Art

In a display panel system, there is often a need for a source driver of the panel system to achieve a high driving capability at a low power consumption. As slew rate delimits the ability of a buffer circuit in the source driver to respond an abrupt change of input signal, it is ideal to enhance the slew rate of the buffer circuit. Likewise, a conventional SRE circuit would determine whether the panel system is turned on and generate an enhanced current to enhance the slew rate by a threshold voltage (VHT) of the panel system. Because a conventional approach to generate the enhanced current is through transconductance capability of metal-oxide-semiconductor field-effect transistors (MOSFET) in the SRE circuit and the enhanced current is exponential in nature, the enhanced current is hard to control. Since the MOSFETs in the SRE circuit are vulnerable to process, voltage and temperature (PVT) variations, the enhanced current generated becomes even more unpredictable and uncontrolled.

The uncontrolled enhanced current would cause the buffer circuit to act abnormally and produces abnormal output waveforms, and the buffer circuit enters a linear region which makes the SRE invalid. Excessive current enhancement causes an increase in power consumption and electromagnetic interference (EMI) issues, which makes a conventional SRE circuit unpredictable and difficult to design. Also, conventionally, different devices are being used for detecting the rising edge and the falling edge of the output waveform, the rising and the falling edge of the output waveform from the conventional SRE circuit may vary and the output waveform may be asymmetric. As the display panel resolution increases and charging time shortens, the symmetry between the rising and falling edges of waveform becomes more important. If the waveform becomes asymmetric, the current recovery rate of the panel system will be greatly reduced, causing excessive power consumption and non-ideal EMI and TP (touch panel) noises.

Therefore, there is a need for a circuit and a method that is capable of linearly enhancing and setting the slew rate that would not vary with varying PVT, to independently enhance the rising and falling edges of the output waveform such that the output waveform symmetry may be addressed, and to vary the slew rate with switching of power modes.

SUMMARY

This disclosure relates to a slew rate enhancement (SRE) circuit, and more particularly, to a circuit on improving slew rate of a buffer circuit.

The disclosure provides a slew rate enhancement apparatus that is connected to an operational amplifier that receives an input signal and generates an output signal according to the input signal for driving a pixel. The slew rate enhancement apparatus comprises a signal edge detector, a comparator, an adjustment unit. The signal edge detector is coupled to the operational amplifier and configured to detect a signal edge and outputting a difference signal corresponding to a difference between the input and output signals. The comparator is coupled to the signal edge detector to receive the difference signal and configured to generate a control signal according to the difference signal. The adjustment unit is coupled to the comparator to receive the control signal, and configured to couple a compensation signal generated by a current source to the operational amplifier according to the control signal to enhance a slew rate of the operation amplifier.

The disclosure provides a display panel with a slew rate enhancement. The display panel comprises a controller, a display panel, a gate driving circuit, and a source driving circuit. The controller receives display data to display an image. The display panel includes a plurality of source lines, a plurality of gate line, and a plurality of pixels at an intersection of the source lines and the gate lines. The gate driving circuit is coupled to each of the gate lines. The source driving circuit is configured to drive the display panel according to the display data, which comprises a plurality of operational amplifiers, a slew rate enhancement circuit. The plurality of operational amplifiers are respectively coupled to the source lines. Each of the operational amplifier is configured to receive an input signal and generate an output signal according to the input signal for driving the pixel connected to the corresponding source line. The slew rate enhancement circuit is configured to couple a power source to at least one of the operational amplifiers to enhance a slew rate of the at least one of the operational amplifiers.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
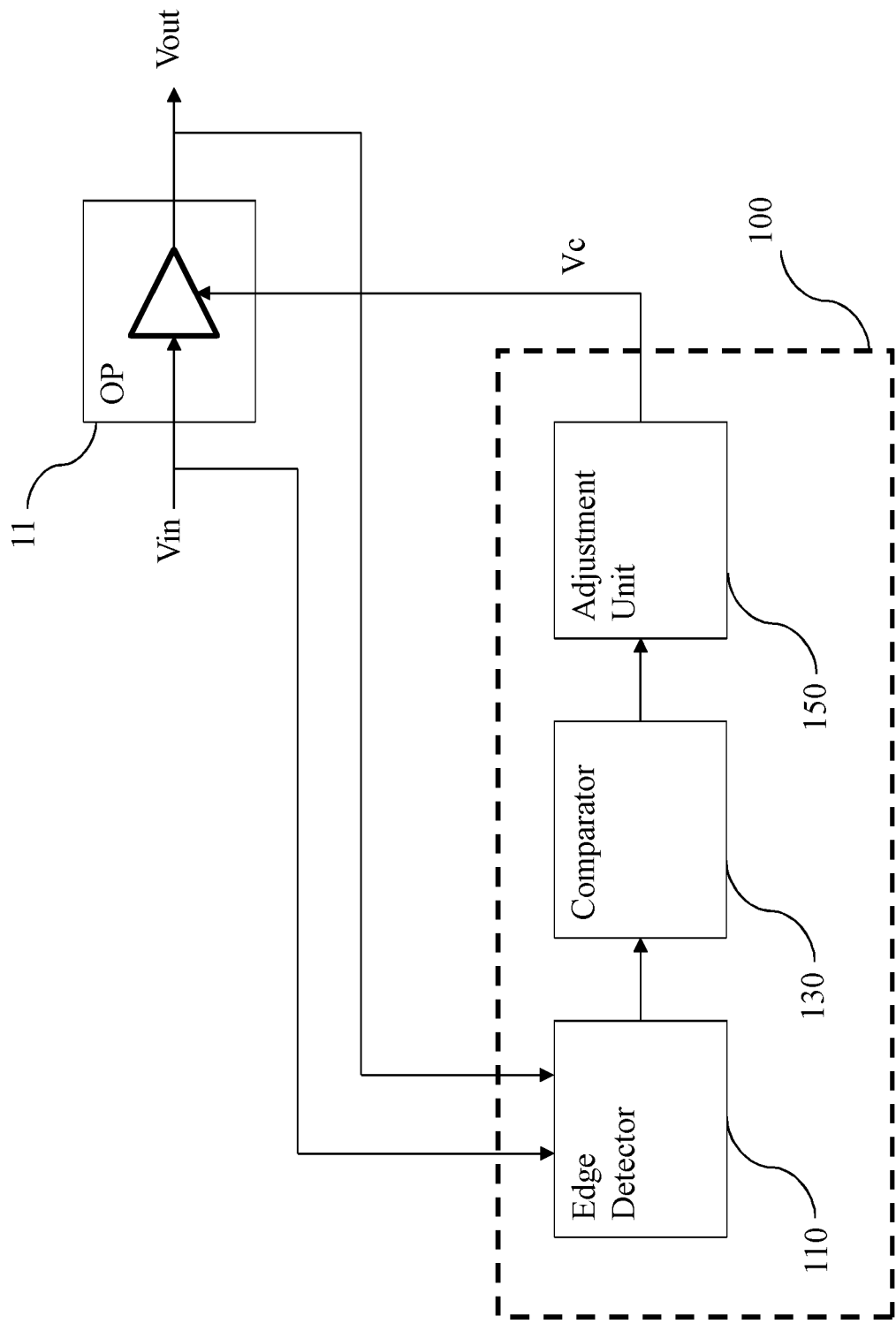
FIG. 1 is a block diagram illustrating an operational amplifier 11 with a slew rate enhancement (SRE) circuit according to one of the embodiments of the disclosure.

The following disclosure provides many different exemplary embodiments, or examples, for implementing different features of the present disclosure. It is to be understood that other embodiments may be utilized and structural changes may be made without departing from the scope of the disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings. As used herein, the singular forms "a," "an" and "the" are intended to include the plural forms as well, unless the context clearly indicates otherwise. Like numerals may refer to like elements throughout the specification and drawings. In addition, the present disclosure may repeat reference numerals and/or letters in the various examples. This repetition is for the purpose of simplicity and clarity and does not in itself dictate a relationship between the various embodiments and/or configurations discussed.

In the embodiments of the disclosure, the slew rate enhancement apparatus generates a control signal according to a difference between the input signal and the output signal. The control signal is used to respectively control the switching of a plurality of current sources, thereby respectively controlling a rising edge and a falling edge of the output waveform. In this way, enhanced currents generated are not vulnerable to PVT variations. Through digitally controlling the current sources for generating enhanced currents, the rising edge and the falling edge of the output waveform may be respectively and linearly enhanced, and the enhanced currents may be flexibly adjusted for different power modes.

FIG. 1 is a block diagram illustrating an operational amplifier 11 with a slew rate enhancement (SRE) circuit 100 according to one of the embodiments of the disclosure. In the embodiment, the operational amplifier 11 may be a buffer circuit of a source driver for driving a display panel. The operational amplifier 11 may represent a plurality of operational amplifiers, where each of the operational amplifiers is electrically connected to a data line of the display panel. Alternatively, the operational amplifier 11 may represent one operational amplifier 11 electrically connected to a data line (may also be referred to as a channel) of the display panel. Referring to FIG. 1, an input signal Vin is coupled to an input of the operational amplifier 11. In the embodiment, the input signal Vin may be voltage or current representing pixel data and may be received from a digital-to-analog converter (DAC) of the source driving circuit. An output signal Vout being output from the operational amplifier 11 is electrically connected to a data line of the display panel, which may be a voltage or a current.

In the embodiment, the SRE circuit 100 is electrically coupled to the operational amplifier 11 for enhancing the slew rate of the operational amplifier 11. In detail, the input signal Vin and the output signal Vout of the operational amplifier 11 are coupled to the SRE circuit 100 as feedbacks, and an output of the SRE circuit 100 is coupled to the operational amplifier 11. The SRE circuit 100 generates a compensation signal V, which may be a voltage or a current, based on the input signal Vin and the output signal Vout of the operational amplifier 11, so as to enhancement the slew rate of the output signal Vout.

Referring to FIG. 1, the SRE circuit 100 includes a signal edge detector 110, a comparator 130, and an adjustment unit 150. The signal edge detector 110 receives the input signal Vin and the output signal Vout of the operational amplifier 11. The signal edge detector 110 detects arising edge and a falling edge of the input and output signals Vin, Vout. Since the output of the operational amplifier 11 takes time to charge in response to a reception of the input signal Vin, the output signal Vout of the operational amplifier 11 would slowly climb up to the desired voltage level at the output of the operational amplifier 11 (i.e., slew rate), which results in a transition delay in transition between the states at the output of the operational amplifier 11 (e.g., transition between low and high states). Therefore, each time the state (low or high) of the input signal Vin changes, the signal edge detector 110 would detect a difference or change between the input and output signals Vin, Vout. In response to the difference between the input and output signals Vin, Vout, the signal edge detector 110 outputs an edge detection signal. In the embodiment, the difference between the input and output signal Vin, Vout may be represented by a difference current Idiff, which would be described in detail later. The comparator 130 receives the signal edge detection signal from the signal edge detector 110 and outputs a control signal for activating the adjustment unit 150. The adjustment unit 150 is coupled to a supply voltage (e.g., Vdd or Vss) and the operational amplifier 11. Upon reception of the control signal from the comparator 130, the adjustment unit 150 enhances the operational amplifier 11 by coupling the operational amplifier to the supply voltage, so that the output of the operational amplifier 11 may have a faster response time. As described before, in the conventional buffer circuit or source driving circuit, the slew rate is enhanced by adjusting the gain (gm) of the operational amplifier, which depends on the transconductance capability of the operational amplifier. However, such conventional method is limited by the physical capability of the operational amplifier (e.g., defect in the process of making the operational amplifier) and the environment of the operation (e.g., temperature, voltage level of the power supply, etc.) Different from the conventional slew rate enhancement, the slew rate enhancement circuit of the disclosure couples the power supply to the operational amplifier 11 according to the difference between the input and output signals Vin, Vout of the operational amplifier 11. In this way, the SRE circuit may accurately and linearly control the output of the operational amplifier 11 (i.e., a linear slew rate enhancement.)

Figure 2:
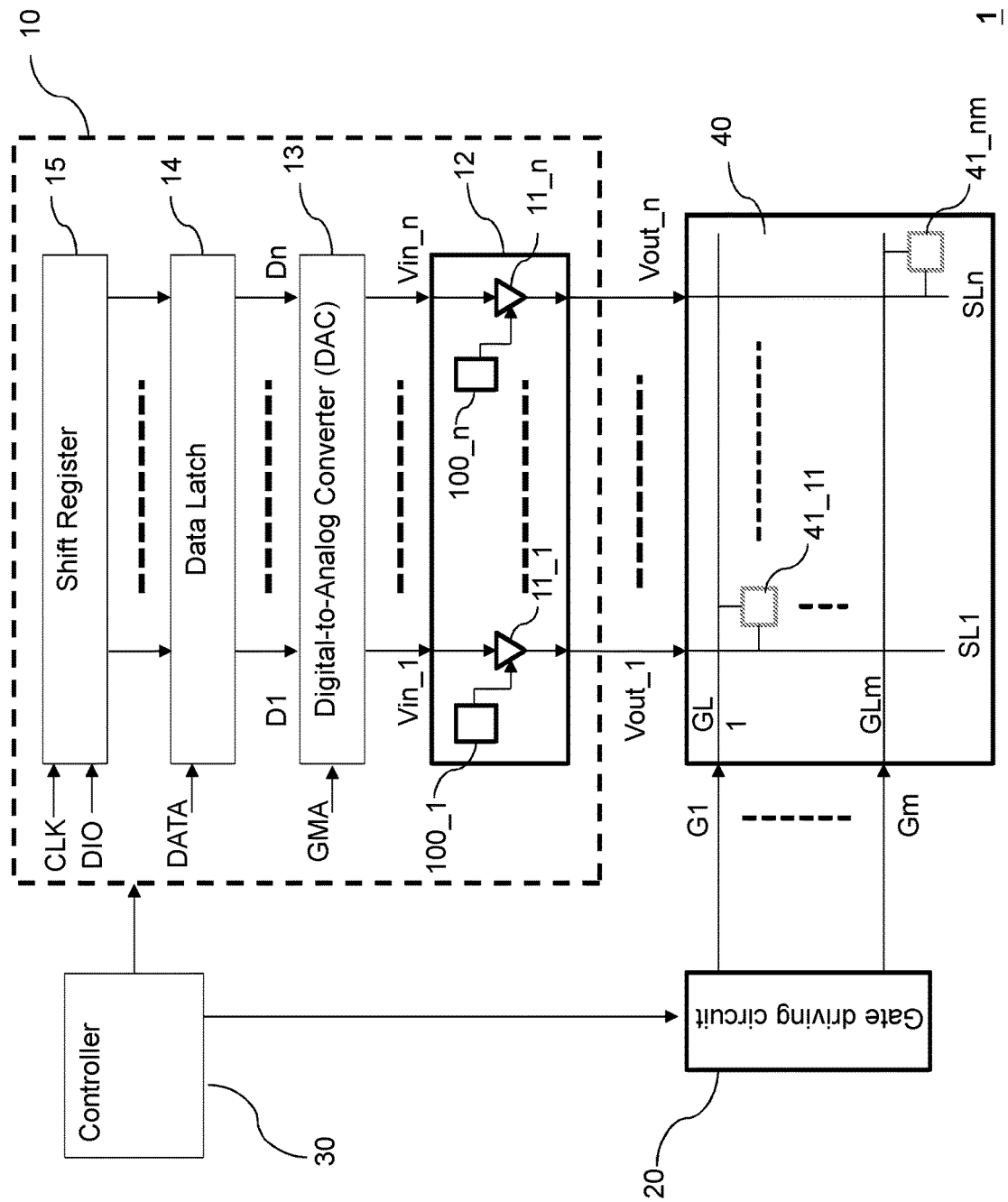
FIG. 2 is a block diagram illustrating a display device according to one of the embodiments of the disclosure.

FIG. 2 is a block diagram illustrating a display device 1 according to one of the embodiments of the disclosure. The display device 1 includes a source driving circuit 10, a gate driving circuit 20, a controller 30, and a display panel 40.

The controller 30 receives RGB video signals R, G and B and control signals, such as a vertical sync signal, a horizontal sync signal, a main clock signal, and a data enable signal. The controller 30 may generate a source control signal and a gate control signal based on the control signals. Thus, the controller 30 may transmit the gate control signal to the gate driving circuit 20 and the source control signal and the pixel data DATA (such as R, G, B) to the source driving circuit 10.

The source driving circuit 10 includes a plurality of source drive ICs (not shown). The gate driving circuit 20 includes a plurality of gate drive integrated circuits (ICs) (not shown). The pixel data DATA may determine a gray level with respect to each pixel. The source driving circuit 10 may apply the source signals to the source lines SL1-SLn arranged on the display panel 40, and the gate driving circuit 20 may apply the gate signal to the gate lines GL1-GLm arranged on the display panel 40.

In detail, the source driving circuit 10 may include an output buffer circuit 12, a digital-to-analog converter (DAC)

13, a data latch circuit 14, and a shift register 15. The output buffer circuit 12 includes a plurality of operational amplifiers 11_1-11_n and a slew rate enhancement (SRE) circuit 100, where n is a positive integer. The SRE circuit 100 is configured to generate a compensation signal Vc based on a difference between an input signal Vin and an output signal Vout. The compensation signal Vc provides a compensation current to the operational amplifiers 11_1-11_n, so as to reduce a transition time of the output signal Vout of the operational amplifier 11. Thus, each output signal Vout of the output buffer circuit 12 may have a short transition time and a high slew-rate.

In the embodiment, the shift register 15 generates a pulse signal based on a clock signal CLK and an input/output control signal. The data latch circuit 14 may receive pixel data DATA such as R, G, B data which may be received from the controller 30. The data latch circuit 14 may latch the data according to a shift sequence of the shift register 15 and output the data. The digital-to-analog converter 13 generates input voltage signals Vin_1 to Vin_n, which are analog signals D1 to Dn of the data latch circuit 14 using a gray voltage GMA. The output buffer circuit 12 may enhance a slew rate and buffer the input voltage signals Vin_1 to Vin_n to generate source signals for driving the display panel 40. The display panel 40 includes a plurality source lines SL1-SLn, a plurality of gate lines GL1-GLm, and a plurality of pixels (such as TFTs) 41_11-41_nm arranged in at each intersection of the source line and the gate line. Each pixel 41 of the display panel 40 receives the gate signal (may also be referred to as a scan signal) through the gate line GL1-GLm from the gate driving circuit 20 and the source signal (may also be referred to as a data signal) through the source line SL1-SLn from the source driving circuit 10. The gate signals may be produced by the gate driving circuit 20 by combining an on-voltage Von and an off-voltage Voff according to a gate control signal and applied to the gate lines GL1 to GLm. The source signals are output to each source line SL1-SLn by the source driving circuit 10 according to a sequence of the data applied to the data latch circuit 14.

In the embodiment illustrated in FIG. 2, the source driving circuit 10 may include a plurality of SRE circuits 100_1-100_n, and each of the operational amplifiers 11_1-11_n may be enhanced by one of the SRE circuits 100_1-100_n. However, the disclosure is not limited thereto. In other embodiment, a plurality of operational amplifiers (e.g., 2, 3, 4, and so on) may share one SRE circuit for slew rate enhancement. This may be referred to as a global bias control for the slew rate enhancement. In the embodiment illustrated in FIG. 2, the SRE circuits 100_1-100_n are included in the output buffer circuit 12. However, the disclosure is not limited thereto. In an alternative embodiment, the SRE circuits 100_1-100_n may be external to the output buffer circuit 12.

In the following, the SRE circuit 100_1-100_n and the slew rate enhancement of the operational amplifier 11_1-11_n would be explained in detail.

Figure 3:
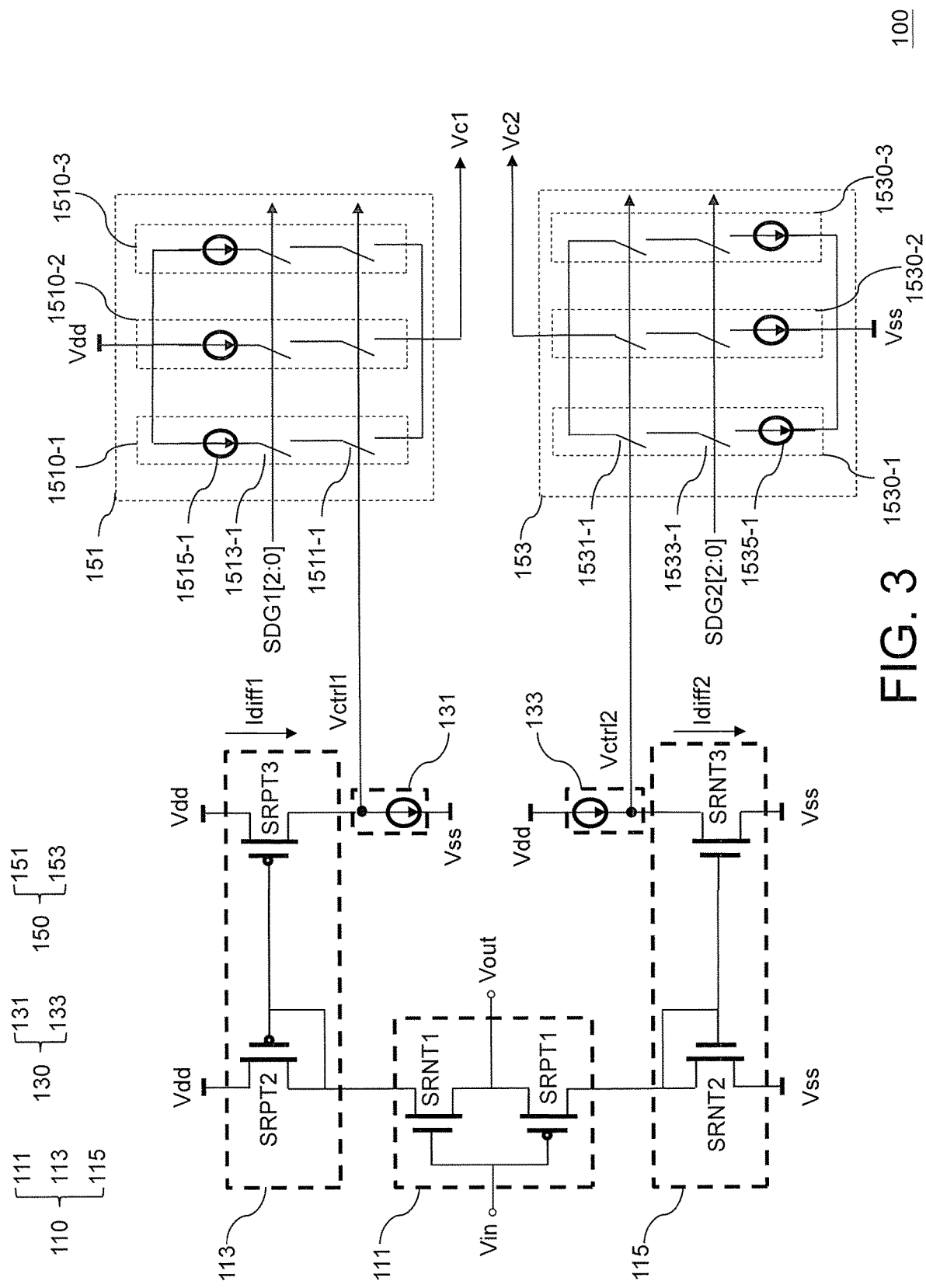
FIG. 3 is a schematic diagram illustrating an SRE circuit according to one of the embodiments of the disclosure.

FIG. 3 is a schematic diagram illustrating the SRE circuit 100 according to one of the embodiments of the disclosure. Referring to FIG. 3, the signal edge detector 110 includes an input/output signal comparator 111, a pull-up control circuit 113, and a push-down control circuit 115. The input/output signal comparator 111 compares the input signal Vin and the output signal Vout respectively received from the input and output of the operational amplifier 11. The input/output signal comparator 111 generates and output a difference signal Idiff corresponding to a difference between the input signal Vin and output signal Vout of the operational amplifier 11 to the pull-up control circuit 113 and the push-down control circuit 115. For example, the pull-up control circuit 113 is enabled at the rising edge of the input and output signals Vin, Vout. The push-down control circuit 115 is enabled at the falling edge of the input and output signals Vin, Vout. The comparator 130 includes a first comparator 131 coupled to the pull-up control circuit 113 and a second comparator 133 coupled to the push-down control circuit 115. The first comparator 131 compares the difference signal Idiff output by the pull-up control circuit 113, and then output a control signal Vctrl1 to enable slew rate enhancement. Similarly, the second comparator 133 compares the difference signal Idiff output by the push-down control circuit 115, and then output a control signal Vctrl2 to enable the slew rate enhancement.

The input/output signal comparator 111 includes a first n-type transistor SRNT1 and a first p-type transistor SRPT1. The first n-type transistor SRNT1 has a control terminal (e.g., gate) coupled to the input signal Vin of the operational amplifier 11, a first terminal (e.g., drain) coupled to the pull-up control circuit 113, and a second terminal (e.g., source) coupled to the output signal Vout of the operational amplifier 11. The first p-type transistor SRPT1 has a control terminal (e.g., gate) coupled to the input signal Vin of the operational amplifier 11, a first terminal (e.g., drain) coupled to the push-down control circuit 115, and a second terminal (e.g., source) coupled to the output signal Vout of the operational amplifier 11.

In the embodiment, the pull-up control circuit 113 and the push-down control circuit 115 may be implemented by current mirrors, where a current representing the difference signal Idiff may be mirrored by the pull-up control circuit 113 and the push-down control circuit 115 and output to the comparator 130. The pull-up control circuit 113 may include a second p-type transistor SRPT2 and a third p-type transistor SRPT3. The second p-type transistor SRPT2 includes a first terminal (e.g., drain), a second terminal (e.g., source) coupled to a first supply voltage Vdd, and a control terminal (e.g., gate), where the first and control terminals are commonly coupled to the first terminal of the first n-type transistor SRNT1 of the input/output signal comparator 111 for receiving a difference signal (may be referred to as a first difference signal, Idiff1). The third p-type transistor SRPT3 includes a first terminal (e.g., drain) coupled to the comparator 130, a second terminal (e.g., source) coupled to the first supply voltage Vdd, and a control terminal (e.g., gate) coupled to the control terminal of the second p-type transistor SRPT2, where the first terminal of the third p-type transistor SRPT3 outputs a mirrored first difference signal corresponding to the first difference signal Idiff1 between the input and output signals Vin, Vout to the first comparator 131.

Similarly, the push-down control circuit 115 includes a second n-type transistor SRNT2 and a third n-type transistor SRNT3, which are connected to form a current mirror. The second n-type transistor SRNT2 includes, a first terminal (e.g., drain), a second terminal (e.g., source) coupled to a second supply voltage Vss, and a control terminal (e.g., gate), where the first and control terminals are commonly coupled to the first terminal of the first p-type transistor SRPT1 of the input/output signal comparator 111 for receiving a difference signal (may be referred to as a second difference signal, Idiff2.) The third n-type transistor SRNT3 includes a first terminal (e.g., drain) coupled to the comparator 130, a second terminal (e.g., source) coupled to the second supply voltage Vss, and a control terminal (e.g., gate)

coupled to the control terminal of the second n-type transistor SRNT2, where the first terminal of the third n-type transistor SRNT3 outputs a mirrored second difference signal corresponding to the second difference signal Idiff2 between the input and output signals Vin, Vout to the second comparator 133.

In the embodiment, the first supply voltage Vdd may be referred to as a supply voltage that defines the high potential in the circuit, such as IV, 3.3V, 5V, or any voltages based on the design requirement. The second supply voltage Vss may be referred to as a supply voltage that defines the low potential in the circuit, such as a ground, 0V, 0.1V, or any voltages based on the design requirement.

In the embodiment, the first and second comparator 131, 133 are current comparators each includes a current source. The first comparator 131 includes a first terminal coupled to the first terminal of the third p-type transistor SRPT3 and a second terminal coupled to the second supply voltage Vss. As described above, the second terminal of the third p-type transistor SRPT3 is coupled to the first supply voltage Vdd. The first comparator 131 compares the first difference signal Idiff1 mirrored by the second and third p-type transistors SRPT2, SRPT3 to a constant current of the current source of the first comparator 131. When the first difference signal Idiff1 has a current greater than the constant current of the current source, the first control signal Vctrl1 would be high. On the other hand, when the first difference signal Idiff1 has a current less than the constant current of the current source, the first control signal Vctrl1 would be low. The second comparator 133 includes a first terminal coupled to the first terminal of the third n-type transistor SRNT3 and a second terminal coupled to the first supply voltage Vdd. The first comparator 131 compares the second difference signal Idiff2 mirrored by the third n-type transistor SRNT3 to a constant current of the current source. When the second difference signal Idiff2 has a current greater than the constant current of the current source, the second control signal Vctrl2 would be low. On the other hand, when the second difference signal Idiff2 has a current less than the constant current of the current source, the second control signal Vctrl2 would be high.

In the embodiment, the adjustment unit 150 includes a sourcing portion 151 and a sinking portion 153. The sourcing portion 151 is coupled to the first control signal Vctrl1 from the first comparator 131 and is configured to output a first compensation signal Vc1 (also referred to as Ic1) for pulling up the output signal Vout of the operational amplifier 11 at the rising edge of the output signal Vout. The sinking portion 153 is coupled to the second control signal Vctrl2 from the second comparator 133 and is configured to output a second compensation signal Vc2 (also referred to as Ic2) for push down the output signal Vout of the operational amplifier 11 at the falling edge of the output signal Vout. Accordingly, the slew rate of the operational amplifier 11 may be enhanced.

The sourcing portion 151 and the sinking portion 153 each includes a plurality of scaling channels that couple the supply voltages Vdd, Vss to the operational amplifier 11 for pull-up or push-down the output signal Vout at rising or falling edge. The number of the scaling channels is enabled by scale control signals SDG1[2:0], SDG2[2:0] which are preset, so as to scale the compensation signals Vc1, Vc2. For example, the adjustment unit 150 may be preconfigured to turn on 2 scaling channels out of 3 scaling channels for enhancing the slew rate. In other embodiments, only 1 channel or all three channels may be enabled by the scale control signals SDG1[2:0], SDG2[2:0] to scale the compensation signals Vc (i.e., Vc1, Vc2). Three channels are shown as an example. However, it is not intended to limit the disclosure. In alternative embodiments, the adjustment unit may include various number of scaling channels such as 1, 2, 4, 5, and so on. Furthermore, the number of scaling channels to be enable for slew rate enhancement may be different between the sourcing portion 151 and the sinking portion 153. In some embodiments, the first scale control signal SDG1[2:0] may be preconfigured to enable 3 channels for enhancing the operational amplifier 11 at rising edge, while the second scale control signal SDG2[2:0] may be preconfigured to enable 2 channels for enhancing the operational amplifier 11 at falling edge. The description of "[2:0]" signifies that the first and second control signals are 3-bit signals, where each scaling channel may be independently controlled. For example, the first scale control signal SDG1[2:0] may be a bus signal that has three different control signals.

In the embodiment, each scaling channel of the souring portion 151 and the sinking portion 153 includes a current source, a first switch, and a second switch, which are connected in series. In the sourcing portion 151, the scaling channels are configured to source current to the operational amplifier 11 from the first supply voltage Vdd, while the scaling channels of the sinking portion 153 are configured to sink current to the second supply voltage Vss from the operational amplifier 11. In detail, each of the channels 1510-1, 1510-2, 1510-3 in the sourcing portion 151 includes a first end coupled to the first supply voltage Vdd and a second end coupled to an output terminal of the adjustment unit 150, which is an output terminal of the SRE circuit 100 that is coupled to the operational amplifier 11. On the other hands, each of the scaling channels 1530-1, 1530-2, 1530-3 in the sinking portion 153 includes a first end coupled to an output terminal of the adjustment unit 150, which is an output terminal of the SRE circuit 100 that is coupled to the operational amplifier 11 and a second end coupled to the second supply power Vss. Each scaling channel includes a first switch, a second switch, and a current source, which are connected in series between one of the first or second power voltage Vdd, Vss and the operational amplifier.

For example, a first channel 1510-1 of the sourcing portion 151 includes a first switch 1511-1, a second switch 1513-1, and a current source 1515-1. In detail, the first switch 1511-1 includes a first terminal coupled to the operational amplifier 11, a second terminal coupled to a first terminal of the switch 1513-1, and a control terminal coupled to the first comparator 131 which receives the first control signal Vctrl1. The second switch 1513-1 also includes a second terminal coupled to a first terminal of the current source 1515-1 and a control terminal coupled the first scale control signal SDG[2:0]. The current source 1515-1 also includes a second terminal coupled to the first supply voltage Vdd. The second and third channels 1510-2, 1510-3 of the sourcing portion 151 as illustrated in FIG. 3 would have the same structure as described in the first channel 1510-1, and thus the detail description of which are not being repeated for brevity.

Referring to FIG. 3, the sinking portion 153 of the adjustment unit 150 also includes a first channel 1530-1, a second channel 1530-2, and a third channel 1530-3, which are connected in series between the operational amplifier 11 and the second supply voltage Vss. The first channel 1530-1 of the sinking portion 153 includes a first switch 1531-1, a second switch 1533-1, and a current source 1535-1. The first switch 1531-1 includes a first terminal coupled to the operational amplifier 11, a second terminal coupled to a first terminal of the second switch 1533-1, and a control terminal coupled to the second comparator 133 which receives the second control signal Vctrl2. The second switch 1533-1 also includes a second terminal coupled to a first terminal of the current source 1535-1 and a control terminal coupled to the second scale control signal SDG2[2:0]. The current source 1535-1 also includes a second terminal coupled to the second supply voltage Vss. The second and third channels 1530-2, 1530-3 as illustrated in FIG. 3 would have similar structure as described in the first channel 1530-1, and thus the detail description of which are not being repeated for brevity.

In the embodiment, the first switch and second switch of each channels in the sourcing and sinking portions 151, 153 may be implemented by transistors such as a MOSFET and the likes.

The first and second scale control signals SDG1[2:0], SDG2[2:0] may be voltage signals that has sufficient potential to turn on and off the second switches in each channels of the sourcing and sinking portion 151, 153. In the embodiment, each of the first and second scale control signals SDG[2:0], SDG2[2:0] may be a 3-bits signal, or any number of bits, that independently controls each channel of the sourcing and sinking portions 151, 153. For example, the first scale control signal SDG1[2:0] may be a bus signal where the control terminal included in each scaling channel of the sourcing portion 151 may be coupled to a line (or signal) on a bus. Accordingly, the second switches in each of the channels 1510-1, 1510-2, 1510-3 of the sourcing portion 151 may be controlled independently or digitally, so as to scale the first compensation signal Vc1. Similarly, for the sinking portion 153, the second scale control signal SDG2 [2:0] may be a bus signal where the control terminal included in each scaling channel of the sinking portion 153 may be coupled to a line (or signal) on a bus. Accordingly, the second switches in each of the channels 1530-1, 1530-2, 1530-3 of the sinking portion 153 may be controlled independently or digitally, so as to scale the second compensation signal Vc2. In the embodiment, the first and second scale control signals SDG[2:0], SDG2[2:0] are predetermined, where the bus signals may be originated from the SRE circuit 100 or a source driving circuit of the display panel. In other embodiments, the predetermination or configuration of the first and second scale control signals SDG1[2:0], SDG2[2:0] may be configured in the timing controller of the display panel. The disclosure is not intended to limit the implementation or the origin of the first and second scale control signals SDG1[2:0], SDG2[2:0].

In the operation of the SRE circuit 100, the input signal Vin of the operational amplifier 11 and the output signal Vout of the operational amplifier 11 are feed into the input/output signal comparator 111 of the SRE circuit 100. In a case where a state change of the output signal Vout being slow than the input signal Vin (e.g., rising edge), the first n-type transistor SRNT1 would be enabled and generating a first difference signal Idiff1. The pull-up control circuit 113 would output the first difference signal Idiff1 to the first comparator 131, where the first comparator 131 would output the first control signal Vctrl1 for enabling the sourcing portion 151 of the adjustment unit 150. The first control signal Vctrl1 would enable the slew rate enhancement by outputting the first compensation signal Vc1. The size or scale of the first compensation signal Vc1 would depends on the predetermined first scale control signal SDG1.

In a case where a state change of the output signal Vout being faster than the input signal Vin (e.g., falling edge), the first p-type transistor SRPT1 would be enabled and generating a second difference signal Idiff2. The push-down control circuit 115 would output the second difference signal Idiff2 to the second comparator 133, where the second comparator 133 would output the second control signal Vctrl2 for enabling the sinking portion 153 of the adjustment unit 150. The second control signal Vctrl2 would enable the slew rate enhancement by outputting the second compensation signal Vc2. The size or scale of the second compensation signal Vc2 would depends on the predetermined second scale control signal SDG2.

Figure 4:
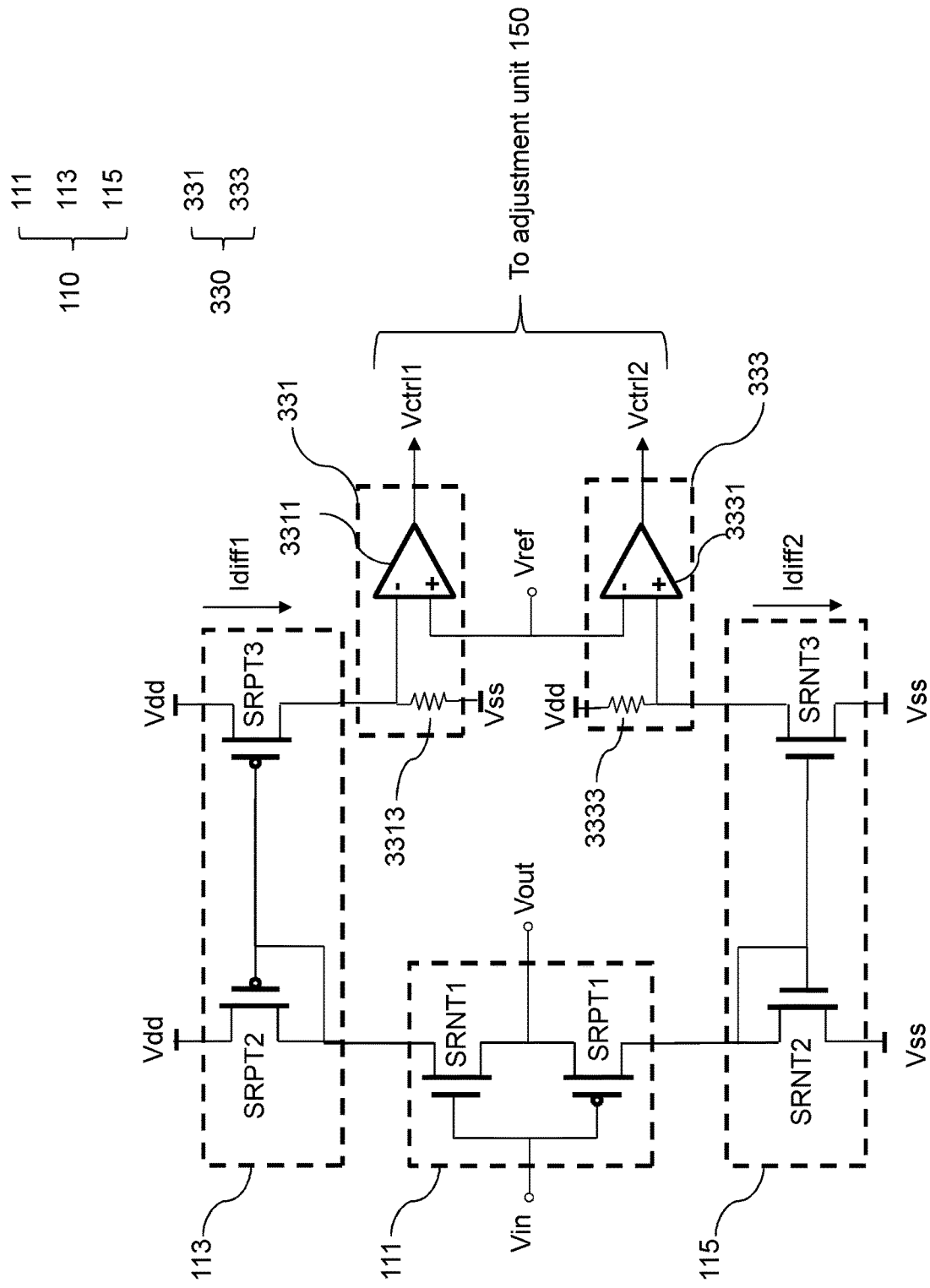
FIG. 4 is a schematic diagram illustrating an SRE circuit according to one of the embodiments of the disclosure.

FIG. 4 is a schematic diagram illustrating a comparator 330 according to one of the embodiments of the disclosure. In the embodiment, the signal edge detector 110 would be the same as the embodiment illustrated in FIG. 3. One of the differences between the embodiments illustrated in FIGS. 2 and 3 is that the embodiment of FIG. 4 utilizes voltage comparator 330 in places of the current comparator 130.

Referring to FIG. 4, the pull-up control circuit 113 and the push-down circuit 115 are coupled to a first comparator 331 and a second comparator 333, respectively. In the embodiment, the first comparator 331 includes an op-amp 3311 and a resistor 3313. The op-amp 3311 includes a first terminal (e.g., inverting terminal) coupled to common node between the output of the pull-up control circuit 113 and one end of the resistor 3313 and a second terminal (e.g., non-inverting terminal) coupled to a reference voltage Vref. Another end of the resistor 3313 is coupled to the second supply voltage Vss. The second comparator 333 includes an op-amp 3331 and a resistor 3333. The op-amp 3331 includes a first terminal (e.g., inverting terminal) coupled to the reference voltage Vref and a second terminal (e.g., non-inverting terminal) coupled to a common node between the output of the push-down control circuit 115 and one end of the resistor 3333. Another end of the resistor 3333 is coupled to the first supply voltage Vdd. The reference voltage Vref may be a constant voltage that is predetermined and configured to output control signals Vctrl1, Vctrl2 based on the design requirements. In the embodiment, the comparator 330 compares the voltages at the output of the pull-up control circuit 113 and the output of the push-down control circuit 115 to the reference voltage Vref, so as to output the first control signal Vctrl1 and the second control signal Vctrl2 according the input and the output signal Vin, Vout. Similar to the embodiment illustrated in FIG. 3, the first and second control signal Vctrl1, Vctrl2 would activate the sourcing portion 151 and the sinking portion 153 of the adjustment unit 150 according to the difference signal Idiff between the input and output signals Vin, Vout.

Figure 5:
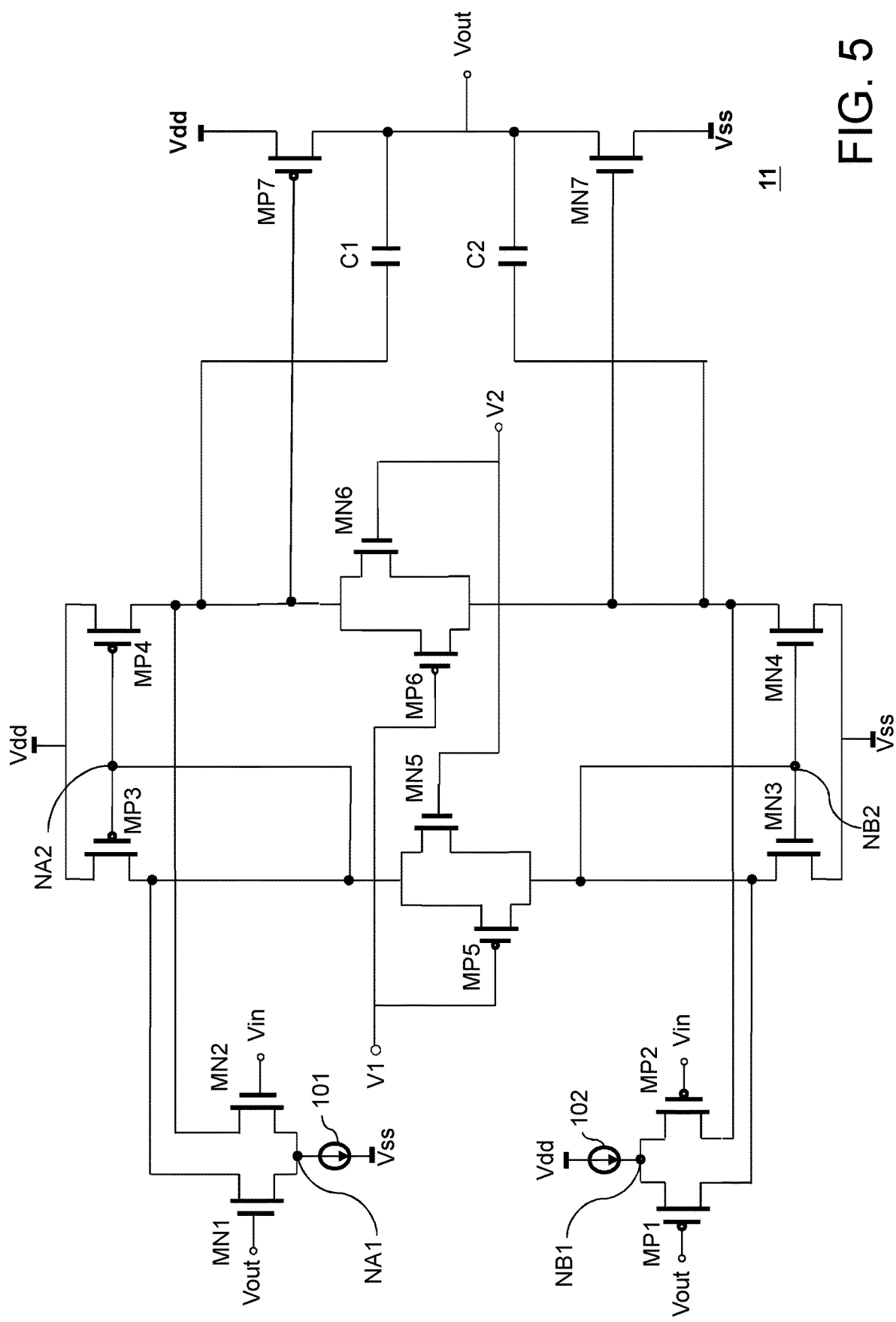
FIG. 5 is a schematic diagram illustrating an operational amplifier according to one of the embodiments of the disclosure.

FIG. 5 is a schematic diagram illustrating an operational amplifier according to one of the embodiments of the disclosure. It should be noted that FIG. 5 merely illustrates a simplified schematic diagram of the operational amplifier 11 as an example. Those skilled in the art would recognize that various electrical components (e.g., transistor, capacitor, resistor, etc.) may also be included in or removed from the operational amplifier 11 in addition to the components shown in FIG. 5. Referring to FIG. 5, the operational amplifier 11 includes n-type transistors MN1-MN7, p-type transistors MP1-MP7, bias circuits 101, 102, a first capacitor C1, and a second capacitor C2. In an input stage of the operational amplifier 11, a first input stage includes n-type transistors MN1, MN2 and the bias circuit 101 coupled to the second supply voltage Vss, and a second input stage includes p-type transistors MP1, MP2 and the bias circuit 102 coupled to the first supply voltage Vdd.

In the first input stage, the n-type transistor MN1 includes a control terminal coupled to the output voltage Vout of the operational amplifier 11, a first terminal coupled to a load stage of the operational amplifier 11 (i.e., subsequent stage to the input stage), and a second terminal coupled a first terminal of the bias circuit 101. The n-type transistor MN2 includes a control terminal coupled to the input voltage Vin, a first terminal coupled to the load stage, and a second terminal coupled to the first terminal of the first bias circuit 101. The first bias circuit 101 also includes a second terminal coupled to the second supply power Vss. The first bias circuit 101 may be implemented by a transistor or other components that generates a constant current based on the second supply voltage Vss. In the embodiment, a common node is formed at an intersection of the second terminals of the n-type transistor MN1, MN2 and the first terminal of the first bias circuit 101, which may also be referred to a first upper common node, NA1.

In the second input stage, the p-type transistor MP1 includes a control terminal coupled to the output voltage Vout of the operational amplifier 11, a first terminal coupled to the load stage, and a second terminal coupled a first terminal of the bias circuit 102. The p-type transistor MP2 includes a control terminal coupled to the input voltage Vin, a first terminal coupled to the load stage, and a second terminal coupled to the first terminal of the second bias circuit 102. The bias circuit 102 also includes a second terminal coupled to the first supply power Vdd. The second bias circuit 102 may be implemented by a transistor or other components that generates a constant current based on the first supply voltage Vdd. In the embodiment, a common node is formed at an intersection of the second terminals of the p-type transistor MP, MP2 and the first terminal of the second bias circuit 102, which may also be referred to a first bottom common node, NB1.

The load stage of the operational amplifier 11 includes the n-type transistors MN3-MN6 and the p-type transistors MP3-MP6. The p-type transistors MP3, MP4 form a first current mirror. The p-type transistor MP3 includes a first terminal coupled to the first input stage (i.e., the first terminal of the n-type transistor MN1), a second terminal coupled to the first supply voltage Vdd, and a control terminal coupled to the first terminal and a control terminal of the p-type transistor MP4. The p-type transistor MP4 also includes a first terminal coupled to the first input stage (i.e., the first terminal of the n-type transistor MN2) and a second terminal coupled to the first supply voltage Vdd. The common node is formed between the control terminals of the p-type transistor MP3, MP4 and the first terminal of the p-type transistor MP3, (which may also be referred to a second upper common node NA2.

The n-type transistors MN3, MN4 form a second current mirror. The n-type transistor MN3 includes a first terminal coupled to the second input stage (i.e., the first terminal of the p-type transistor MP), a second terminal coupled to the second supply voltage Vss, and a control terminal coupled to the first terminal and a control terminal of the n-type transistor MN4. The n-type transistor MN4 also includes a first terminal coupled to the second input stage (i.e., the first terminal of the p-type transistor MP2) and a second terminal coupled to the second supply voltage Vss. The common node is formed between the control terminals of the n-type transistor MN3, MN4 and the first terminal of the n-type transistor MN3, which may also be referred to a second bottom common node NB2.

The load stage of the operational amplifier 11 also includes a first connecting circuit and a second connecting circuit, which are coupled between the first and second current mirrors. In the embodiment, the first connecting circuit includes the p-type transistor MP5 and the n-type transistor MN5. The p-type transistor MP5 includes a first terminal coupled to the second current mirror (i.e., the first terminal of the n-type transistor MN3), a second terminal coupled to the first current mirror (i.e., the first terminal of the p-type transistor MP3), and a control terminal coupled to a first bias voltage V1. The n-type transistor MN5 includes a first terminal coupled to the second terminal of the p-type transistor MP5 and the first current mirror (i.e., the first terminal of the p-type transistor MP3), a second terminal coupled to the first terminal of the p-type transistor MP5 and the second current mirror (i.e., the first terminal of the n-type transistor MN3), and a control terminal coupled to a second bias voltage V2.

The second connecting circuit includes the p-type transistor MP6 and the n-type transistor MN6. The p-type transistor MP6 includes a first terminal coupled to the second current mirror (i.e., the first terminal of the n-type transistor MN4), a second terminal coupled to the first current mirror (i.e., the first terminal of the p-type transistor MP4), and a control terminal coupled to the first bias voltage V1. The n-type transistor MN6 includes a first terminal coupled to the second terminal of the p-type transistor MP6 and the first current mirror (i.e., the second terminal of the p-type transistor MP4), a second terminal coupled to the first terminal of the p-type transistor MP6 and the second current mirror (i.e., the first terminal of the n-type transistor MN4), and a control terminal coupled to the second bias voltage V2.

In the embodiment, the first and second bias voltages V1, V2 are bias voltages used to control the first and second connecting circuits. The p-type transistors MP5, MP6 are controlled based on the first bias voltage V1, and the n-type transistors MN5, MN6 are controlled based on the second bias voltage V2.

The output stage of the operational amplifier 11 includes the p-type transistor MP7 and the n-type transistor MN7. The p-type transistor MP7 includes a control terminal coupled to the load stage (i.e., the first terminal of the p-type transistor MP4), a first terminal coupled to the load stage (i.e., the first terminal of the p-type transistor MP4) through the first capacitor C1, and a second terminal coupled to the first supply voltage Vdd. The n-type transistor MN7, includes a control terminal coupled to the load stage (i.e., the first terminal of the n-type transistor MN4), a first terminal coupled to the load stage (i.e., the first terminal of the n-type transistor MN4) through the second capacitor C2, and a second terminal coupled to the second supply voltage Vss. The output terminal of the operational amplifier would be a common node formed between the first terminal of the p-type transistor MP7 and the first terminal of the n-type transistor MN7.

Referring to FIGS. 2 and 4, the output through rate of the operational amplifier may be changed by coupling the first and second compensation signal Vc1, Vc2 to the operational amplifier 11 for enhancing the slew rate of the operational amplifier 11. In one of the embodiments, the first compensation signal Vc1 from the adjustment unit 150 may be coupled to the first upper node NA1 to pull-up the output of the operational amplifier 11 for enhancing the slew rate at the rising edge. The second compensation signal Vc2 from the adjustment unit 150 may be coupled to the first bottom node NB1 to push-down the output of the operational amplifier 11 for enhancing the slew rate at the falling edge.

In other embodiments, the first compensation signal Vc1 from the adjustment unit 150 may be coupled to the second upper node NA2 to pull-up the output of the operational amplifier for enhancing the slew rate at the rising edge. The second compensation signal Vc2 from the adjustment unit 150 may be coupled to the second bottom node NB2 to push-down the output of the operational amplifier 11 for enhancing the slew rate at the falling edge.

Figure 6:
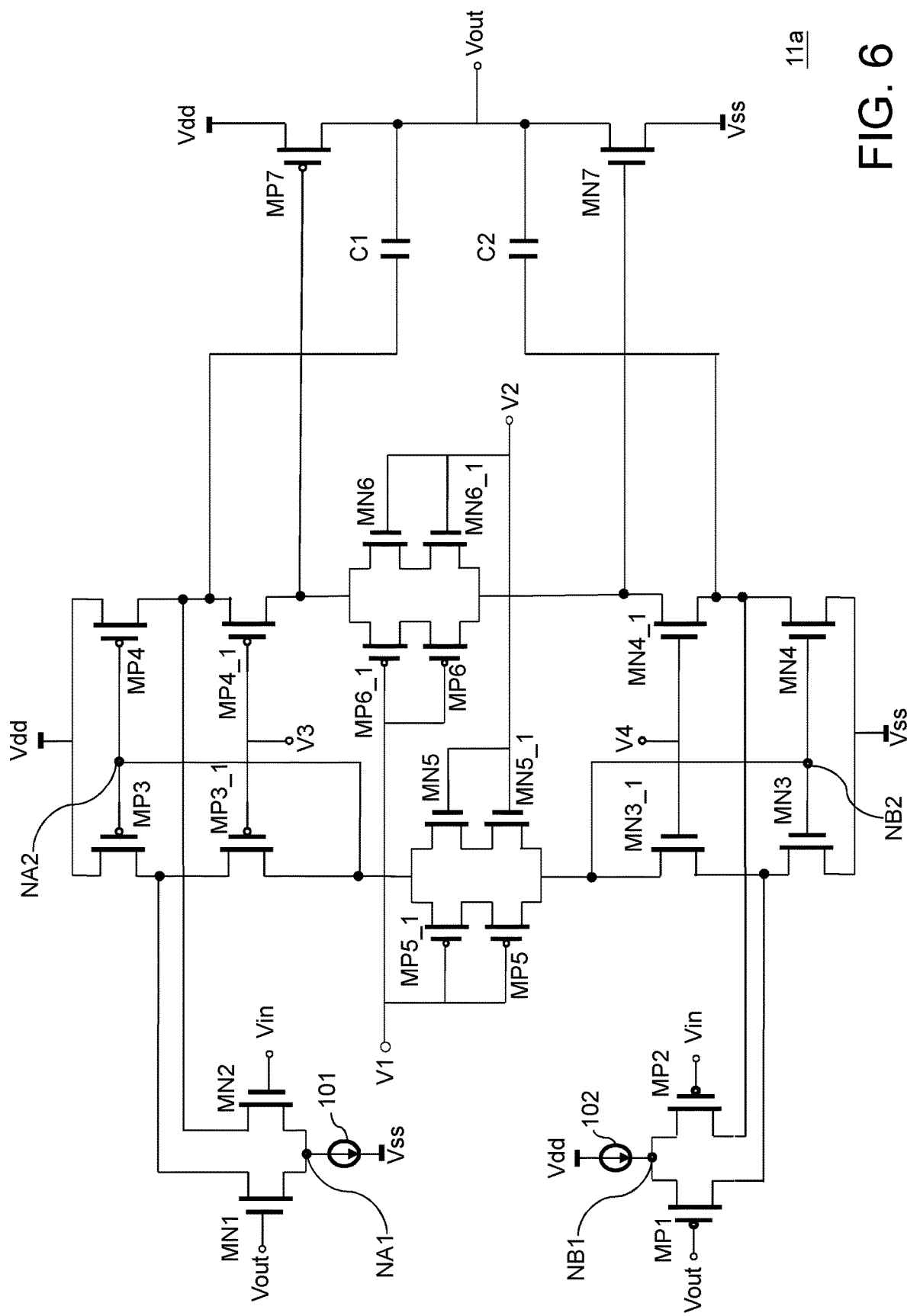
FIG. 6 is a schematic diagram illustrating an operational amplifier according to one of the embodiments of the disclosure.

FIG. 6 is a schematic diagram illustrating an operational amplifier 11a according to one of the embodiments of the disclosure. The differences between the embodiments illustrated in FIGS. 4 and 5 are the addition of the transistors MP3_1, MP4_1, MP5_1, MP6_1, MN3_1, MN4_1, MN5_1, and MN6_1 in the load stage of the operational amplifier. In the embodiment, the slew rate enhancement may also be achieved by coupling the SRE circuit 100 as illustrated in FIG. 3 to the operational amplifier 11a. Similar to the embodiment illustrated in FIG. 5, the first compensation signal Vc1 from the adjustment unit 150 may be coupled to the first upper node NA1 or the second upper node NA2 to pull-up the output of the operational amplifier 11a for enhancing the slew rate at the rising edge. The second compensation signal Vc2 from the adjustment unit 150 may be coupled to the first bottom node NB1 or the second bottom node NB2 to push-down the output of the operational amplifier 11 for enhancing the slew rate at the falling edge.

In one of the embodiments, the first compensation signal Vc1 may be coupled to the first upper node NA1, while the second compensation signal Vc2 may be coupled to the second bottom node NB2. In other embodiments, the first compensation signal Vc1 may be coupled to the second upper node NA2, while the second compensation signal Vc2 may be coupled to the first bottom node NB1. The disclosure is not intended to limit the coupling relationship between the SRE circuit and the operational amplifier.

Figure 7:
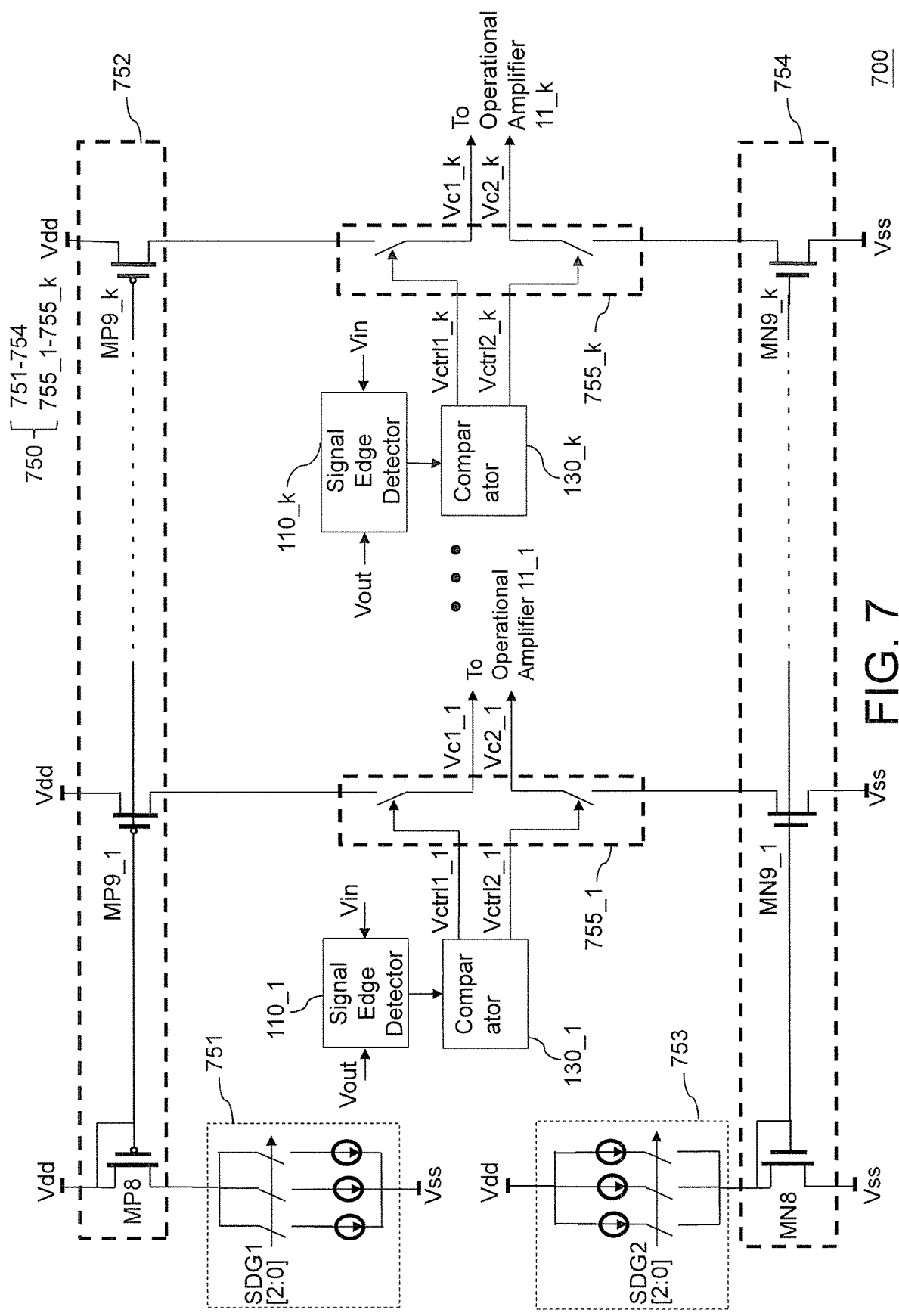
FIG. 7 is a schematic diagram illustrating an SRE circuit with a global adjustment unit according to one of the embodiments of the disclosure.

FIG. 7 is a schematic diagram illustrating an SRE circuit 700 with a global adjustment unit 750 according to one of the embodiments of the disclosure. In the embodiment, a global adjustment unit 750 is utilized to supply compensation signals Vc1, Vc2 to a plurality of operational amplifiers 11_1-11_k, where k is greater than 1 and less than n. Referring back to the embodiments illustrated in FIGS. 3 and 4, the comparators 130 and 330 enable the adjustment unit 150 based on the signal edge detected by the signal detector 110. The adjustment unit 150 may be referred to as a local adjustment unit that provides compensation signal Vc to one operational amplifier 11. Referring to FIG. 7, the SRE circuit 700 includes the signal edge detector 110_1-110_k (one of each source line channel), the comparator 130_1-130_k (one of each source line channel), and the adjustment unit 750. The signal edge detector 110_1-110_k and the comparator 130_1-130_k are substantially the same as the embodiment of FIG. 3. Since the adjustment unit 750 is global (i.e., shared between different source line channels), the structure would be different from the embodiment illustrated in FIG. 3. However, the concept of the adjustment unit 750 and the adjustment unit 150 illustrated in FIG. 3 would be similar, which is to enhance the slew rate of the operational amplifier 11_1-11_k to which the adjustment unit 750 is connected.

Referring to FIG. 7, the adjustment unit 750 is used to compensate a plurality of operational amplifiers 11_1-11_k respectively coupled to a plurality of source line SL1-SLk, which may be referred to as source line channels. The adjustment unit 750 includes a sourcing portion 751, a first bias generation circuit 752, a sinking portion 753, a second bias generation circuit 754, and a plurality of compensation enabling circuits 755_1-755_k. The sourcing portion 751 is coupled between the second power voltage Vss and the first bias generation circuit 752. The sinking portion 753 is coupled between the first power voltage Vdd and the second bias generation circuit 754. Each of the compensation enabling circuits 755_1-755_k is coupled between the first and second bias generation circuit 752, 754 and controlled by the first and second compensation signals Vctrl1, Vctrl2 provided by the comparator 130_1-130_k. The variable k may be any number between one and n. For example, if k=3, the adjustment unit 750 is used to provide compensation signals such as a compensation voltage or current to three source line channels.

The sourcing portion 751 includes three scaling channels for scaling the compensation signal in three different levels, which are connected in parallel between the first bias control circuit 752 and the second supply voltage Vss. It should be noted the number of scaling channels may be any number greater than zero based on the design requirement. For example, in an alternative embodiment, the operational amplifier requires a finer (or high resolution) step compensations signal, the number of the scaling channels may increase, which increases the number of levels in the slew rate enhancement. Each scaling channel includes a switch controlled by a first predetermined scaling control signal SDG1[2:0] and a current source connected in series with the switch. The switch of each scaling channel may be controlled independently by three different scaling control signals (i.e., SDG1[2:0], a 3-bit signal). The enabling of the switch in any one of the scaling channels would couple the current source of that scaling channel to the first bias control circuit 752, which generates a compensation signal for enhancing the slew rate at rising edge. More scaling channel being enabled would increase the level of the compensation signal. The sinking portion 753 also includes three scaling channels connected in parallel between the second bias control circuit 754 and the first supply voltage Vdd. Each of the scaling channels of the sinking portion 753 includes a switch controlled by a second predetermined scaling control signal SDG2[2:0] and a current source connected in series with the switch. The switch of each scaling channel may be controlled independently by three different scaling control signals (i.e., SDG2[2:0], a 3-bit signal). The enabling of the switch in any one of the scaling channels would couple the current source of that scaling channel to the second bias control circuit 754, which generates a compensation signal for enhancing the slew rate at falling edge. More scaling channel being enabled would increase the level of the compensation signal. In should be noted that, in other embodiments, the sinking portion 753 may include different number of scaling channels as compared to the sourcing portion 751. In some embodiments, the switches of the scaling channels in the souring and sinking portions 751, 753 may be implemented by transistors.

In the embodiment, the first and second bias control circuits 752, 754 may be implemented by current mirrors. The first bias control circuit 752 may include a p-type transistor MP8 and a plurality of p-type transistors MP9_1-MP9_k. The p-type transistor MP8 includes a first terminal coupled to the sourcing portion 751, a second terminal coupled to the first supply voltage Vdd, and a control terminal coupled to the second terminal and each of the p-type transistors MP9_1-MP9_k. Each of the p-type transistors MP9_1-MP9_k includes a control terminal coupled to the control terminal of the p-type transistor MP9 which forms a current mirror with the p-type transistor MP8. Each of the p-type transistors MP9_1-MP9_k also includes a first terminal coupled to the corresponding compensation enabling circuit 755_1-755_k and a second terminal coupled to the first supply voltage Vdd. The second bias control circuit 754 may include a n-type transistor MN8 and a plurality of n-type transistors MN9_1-MN9_k. The n-type transistor MN8 includes a first terminal coupled to the sinking portion 753, a second terminal coupled to the second supply voltage Vss, and a control terminal coupled to the second terminal and each of the n-type transistors MN9_1-MN9_k. Each of the n-type transistors MN9_1-MN9_k includes a control terminal coupled to the control terminal of the n-type transistor MN9 which forms a current mirror with the n-type transistor MN8. Each of the n-type transistors MN9_1-MN9_k also includes a first terminal coupled to the corresponding compensation enabling circuit 755_1-755_k and a second terminal coupled to the second supply voltage Vss.

Each of the compensation enabling circuit 755_1-755_k is coupled between the first and second bias control circuits 752, 754 and one of the operational amplifiers 11_1-11_k and controlled by the corresponding comparator 130_1-130_k based on the output of the signal edge detector 110_1-110_k. Each of the compensation enabling circuit 755_1-755_k may include a sourcing switch and a sinking switch. The sourcing switch is coupled between the p-type transistor MP9_1 and the operational amplifier 11_1 and controlled by the first compensation signal Vc1_1 from the comparator 130_1 in response to the signal edge detection at the rising edge. The sinking switch is coupled between the n-type transistor MN9_1 and the operational amplifier 11_1 and controlled by the second compensation signal Vc2_1 from the comparator 130_1 in response to the signal edge detection at the falling edge. The structure of the 755_2-755_k are the same as the compensation enabling circuit 755_1, and thus the detail of which would be omitted for the purpose of brevity.

In the operation, the sourcing portion 751 and the sinking portion 753 are enabled based on the predetermined scaling control signals SDG1[2:0], SDG2[2:0], which generates a sourcing current and a sinking current. The first and second bias control circuits 752, 754 respectively couples the sourcing current and the sinking current to each of the compensation enabling circuits 755_1-755_k. Upon a detection of a rising edge of the input signal Vin by the signal edge detector 110_1-110_k, the comparator 130_1-130_k would enable the compensation enabling circuits 755_1-755_k by outputting the first compensation signal Vc1_1-Vc1_k. The sourcing switch of the compensation enabling circuits 755_1-755_k would be enabled in response to the first compensation enabling signals Vctrl1_1-Vctrl1_k, which couples the sourcing current from the bias control circuit 752 to the corresponding operational amplifiers 11_1-11_k, so as to perform the slew rate enhancement on the operational amplifiers 11_1-11_k. On the other hand, upon a detection of a falling edge of the input signal Vin by the signal edge detector 110_1-110_k, the comparator 130_1-130_k would enable the compensation enabling circuits 755_1-755_k by outputting the second compensation signal Vctrl2_1-Vctrl2_k. The sinking switch of the compensation enabling circuits 755_1-755_k would be enabled in response to the second compensation enabling signals Vctrl2_1-Vctrl2_k, which couples the sinking current from the bias control circuit 754 to the corresponding operational amplifiers 11_1-11_k, so as to perform the slew rate enhancement on the operational amplifiers 11_1-11_k.

Figure 8:
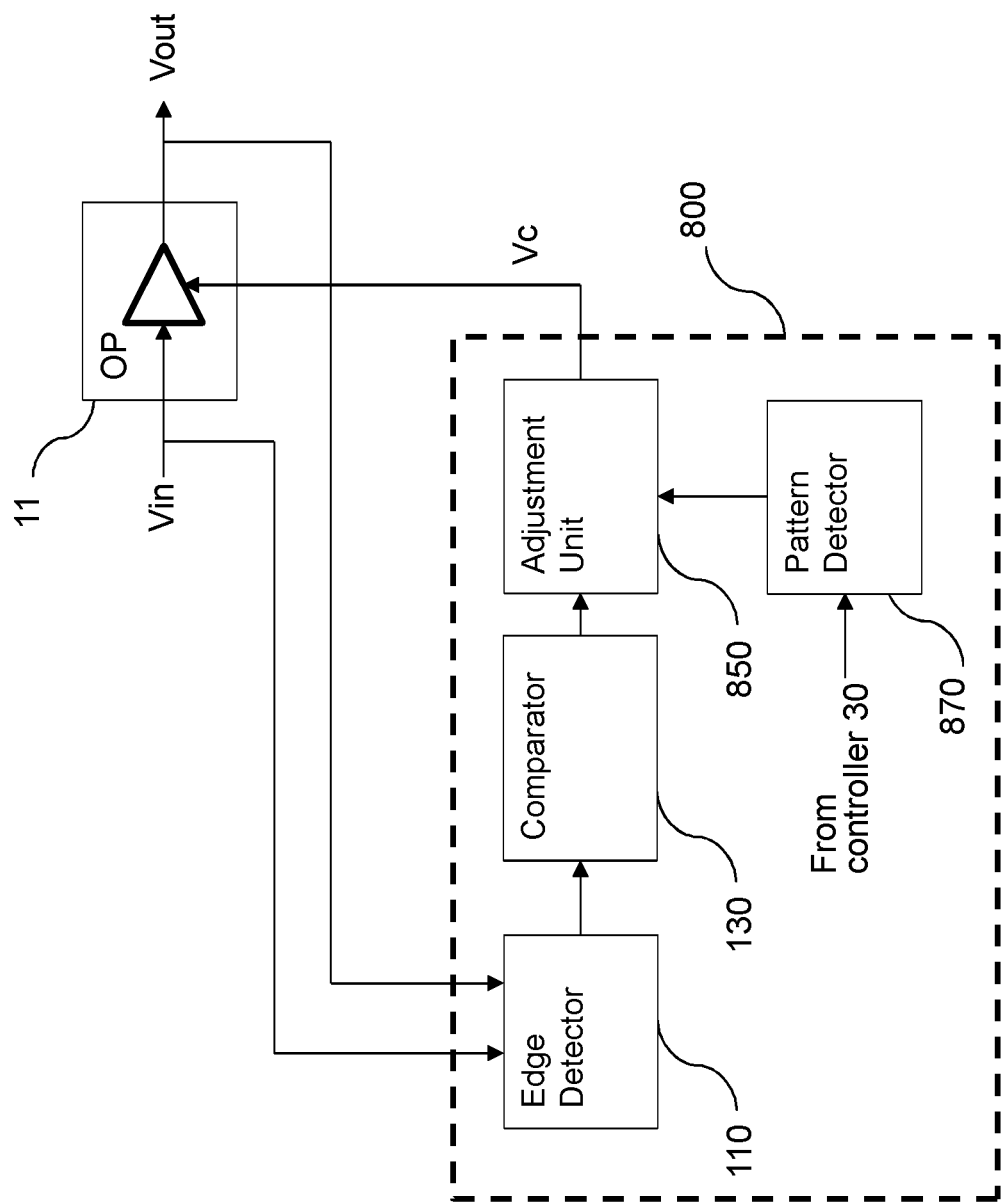
FIG. 8 illustrates a block diagram of an SRE circuit according to an embodiment of the disclosure.

FIG. 8 illustrates a block diagram of an SRE circuit 800 according to an embodiment of the disclosure. One of the differences between the SRE circuit 800 and the SRE circuit 100 illustrated in FIG. 1 is the addition of a pattern detector 870 coupled to the adjustment unit 850. The pattern detector 870 is used to enhance some operational amplifier during a power saving mode of the display panel. For example, during the power saving mode, only a portion (i.e., some pixels) of the display panel requires sharp image display. In some embodiments, only the portion of the display panel has image to display while other portions of the display panel are black or non-changing. The embodiment is to selectively perform slew rate enhancement on the operational amplifier 11 of the corresponding portion of the display panel. For example, when entering the power saving mode, when it is indicated that a specific channel needs to be maintained at a high slew rate, the pattern detector is configured to dynamically adjust the adjustment circuit 850, presenting the ability to independently control the slew rate of a specific channel and to achieve a more accurate power saving state. This may also be referred to as a dynamic slew rate enhancement (DSRE).

In detail, the SRE circuit 800 may be coupled to the controller 30 for obtaining a power saving information. The power saving information may include the source line channels (i.e., a channel formed by operational amplifiers connected to a source line) that requires slew rate enhancement during the power saving mode. The power saving information is provided to the pattern detector 870. The pattern detector 870 may enable or disable the adjustment unit 850 according to the power saving information. Accordingly, the SRE 800 is capable of dynamically and selectively enable or disable a slew rate enhancement of a particular source line channel.

In view of the above, in the embodiments of the disclosure, the slew rate enhancement circuit generates a control signal according to a difference between the input signal and the output signal. The control signal is used to selectively couple a plurality of current sources to the operational amplifier, thereby respectively controlling a rising edge and a falling edge of the output waveform. In other words, a compensation signal may be output for slew rate enhancement by coupling the current sources to the operational amplifier. Depending on a detection of rising or falling edge of the input signal, the SRE circuit may pull-up or push-down the output signal according to the compensation signal. Furthermore, the compensation signal may be digitally controlled by selectively enabling the number of current sources to be coupled to the operational amplifier, so as to scale the compensation signal that is to be coupled to the operational amplifier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A slew rate enhancement apparatus, connected to an operational amplifier that receives an input signal and generates an output signal according to the input signal for driving a pixel, comprising: a signal edge detector, coupled to the operational amplifier, detecting a signal edge and outputting a difference signal corresponding to a difference between the input and output signals; a comparator, coupled to the signal edge detector to receive the difference signal and generating a control signal according to the difference signal; and an adjustment unit, coupled to the comparator to receive the control signal, and configured to couple a compensation signal generated by a current source to the operational amplifier according to the control signal to enhance a slew rate of the operation amplifier, wherein the adjustment unit comprises: a sourcing portion, providing a first compensation current through the current source based on the control signal; and a sinking portion, draining a second compensation current through the current source based on the control signal.

2. The slew rate enhancement apparatus according to claim 1, wherein the adjustment unit comprises a plurality of scaling channels coupled between a supply power and the operational amplifier in parallel, wherein each scaling channel comprises the current source coupled to the supply power, a first switch coupled to the control signal from the comparator, a second switch 25 coupled to a predetermined scaling control signal, and the current source and the first and second switches are connected in series.

3. The slew rate enhancement apparatus according to claim 2, wherein the predetermined scaling control signal is a bus signal which is configured to independently control the second switch of each scaling channel.

4. The slew rate enhancement apparatus according to claim 1, wherein the adjustment unit comprises: a bias scaling portion, scaling the compensation signal according to a scaling control signal; a bias control portion, generating the compensation signal; and a compensation enabling portion, receiving the control signal and coupling the compensation signal to the operational amplifier according to the control signal.

5. The slew rate enhancement apparatus according to claim 4, wherein the operational amplifier comprises a plurality of operational amplifiers each coupled to a source line of a display panel, and wherein the compensation enabling portion comprises a plurality of compensation enabling portions, each of the compensation enabling portions is configured to couple the compensation signal generated by the bias scaling portion through the bias control portion to one of the operational amplifiers according to the control signal from the comparator.

6. The slew rate enhancement apparatus according to claim 4, wherein the bias control portion comprises a current mirror coupled between the bias scaling portion and the compensation enabling portion.

7. The slew rate enhancement apparatus according to claim 1, wherein the operational amplifier comprises an input stage, a load stage and an output stage, and the compensation signal from the adjustment unit is coupled to the input stage of the operational amplifier, as to enhance the slew rate.

8. The slew rate enhancement apparatus according to claim 1, wherein the operational amplifier comprises an input stage, the load stage and an output stage, and the compensation signal from the adjustment unit is coupled to a load stage of the operational amplifier, as to enhance the slew rate.

9. The slew rate enhancement apparatus according to claim 1, wherein the comparator is a voltage comparator configured to compare the difference signal to a reference voltage.

10. The slew rate enhancement apparatus according to claim 1, wherein the comparator is a current comparator configured to compare the difference signal to a predetermined constant voltage.

11. The slew rate enhancement apparatus according to claim 1, further comprising a pattern detector, coupled to the adjustment unit, receiving a display data, and selectively enabling the adjustment unit according to the display data.

12. A display panel, comprising: a controller, receiving display data to display an image; a display panel, including a plurality of source lines, a plurality of gate line, and a plurality of pixels at an intersection of the source lines and the gate lines; 25 a gate driving circuit, coupled to each of the gate lines; and a source driving circuit, configured to drive the display panel according to the display data, comprising: a plurality of operational amplifiers, respectively coupled to the source lines, and each configured to receive an input signal and generate an output signal according to the input signal for driving the pixel connected to the corresponding source line; and a slew rate enhancement circuit, coupling a power source to at least one of the operational amplifiers to enhance a slew rate of the at least one of the operational amplifiers, wherein the adjustment unit comprises: a sourcing portion, providing a first compensation current through the current source based on the control signal; and a sinking portion, draining a second compensation current through the current source based on the control signal.

13. The display panel according to claim 12, wherein the slew rate enhancement circuit comprises: a signal edge detector, coupled to the operational amplifier, receiving the input signal and the output signal of the operational amplifier, detecting a signal edge according to the input and output signals and outputting a difference signal corresponding to a difference between the input and output signals; a comparator, coupled to the signal edge detector to receive the difference signal and generating a control signal according to the difference signal; and an adjustment unit, coupled to the comparator to receive the control signal, and configured to couple the compensation signal generated by the power source to the operational amplifier according to the control signal.

14. The display panel according to claim 12, wherein the adjustment unit comprises a plurality of scaling channels coupled between a supply power and the operational amplifier in parallel, wherein each scaling channel comprises the current source coupled to the supply power, a first switch coupled to the control signal from the comparator, a second switch coupled to a predetermined scaling control signal, and the current source and the first and second switches are connected in series.

15. The display panel according to claim 14, wherein the predetermined scaling control signal is a bus signal which is configured to independently control the second switch of each scaling channel.

16. The display panel according to claim 12, wherein the adjustment unit comprises: a bias scaling portion, scaling the compensation signal according to a scaling control signal; a bias control portion, generating the compensation signal; and a compensation enabling portion, receiving the control signal and coupling the compensation signal to the operational amplifier according to the control signal.

17. The display panel according to claim 16, wherein the compensation enabling portion comprises a plurality of compensation enabling portions, each of the compensation enabling portions is configured to couple the compensation signal generated by the bias scaling portion through the bias control portion to one of the operational amplifiers according to the control signal from the comparator.

18. The display panel according to claim 12, wherein the slew rate enhancement circuit receives the display data and selectively enhances a portion of the operational amplifier according to the display data, so as to enhance the pixels connected to the enhanced operational amplifiers.

* * * * *